Oct. 10, 1967 B. P. FLASHMAN 3,346,351
SUPERCONDUCTIVE CONNECTION
Filed Dec. 17, 1964

Inventor:
Barry P. Flashman,
by Paul R. Webb, II
His Attorney.

United States Patent Office 3,346,351
Patented Oct. 10, 1967

3,346,351
SUPERCONDUCTIVE CONNECTION

Barry P. Flashman, Schenectady, N.Y., assignor to General Electric Company, a corporation of New York Filed Dec. 17, 1964, Ser. No. 419,158
11 Claims. (Cl. 29—194)

ABSTRACT OF THE DISCLOSURE

A superconductive connection between two superconductive members, one or both of which members are niobium, is effectuated utilizing a solder chosen from the group consisting of indium-lead alloys and indium-bismuth alloys. In making the superconducting connection, molten solder preferably is rubbed onto the niobium surface utilizing a metal brush and the other superconductive member subsequently is pressed against the molten solder for a time interval sufficient to harden the solder thereby forming a superconductive connection between the members.

This invention relates to superconductive connections and more particularly to superconductive connections wherein one of the members of the electrical connection consists of niobium.

In cryogenic devices, superconductive connections are required to join together superconductive members. For example, groundplanes in a cryogenic device require such a connection. A groundplane comprises generally a substrate, for example of glass, and a superconductive metallic film deposited thereon. It is then necessary to connect electrically the superconductive metallic film of one groundplane with the films of adjacent groundplanes thereby resulting in a plurality of superconductively connected groundplanes. Presently, a substrate, for example of glass, is employed on which is deposited a superconductive lead layer or film except around the edges of the substrate. These groundplanes are connected electrically by employing one or more lead connectors which are soldered to adjacent superconductive films by using conventional lead-tin solders.

It would be desirable to provide a groundplane which employs a superconductive film of niobium on the substrate. This structure would be connected by superconductive connectors to adjacent groundplanes. However, a serious problem arises in that conventional solders, such as lead-tin solder, which are used to solder a lead connector to a lead film, are not suitable for soldering a superconductive connector to a niobium film or member.

The present invention is directed to an improved superconductive connection wherein two superconductive members, one of which consists of niobium, are joined together by a superconductive alloy solder.

It is an object of my invention to provide a superconductive connection.

It is another object of my invention to provide a superconductive connection wherein one of the members of the connection consists of niobium, and the members are joined together by a superconductive alloy solder.

It is a further object of my invention to provide a superconductive connection wherein one of the members of the connection consists of a niobium film.

In carrying out my invention in one form, a superconductive connection comprises a first superconductive member, a second superconductive member, one of said members consisting of niobium, and a superconductive alloy solder joining together a portion of each of said members, said alloy solder selected from the group consisting of indium-lead alloys and indium-bismuth alloys.

These and various other objects, features, and advantages of the invention will be better understood from the following description taken in connection with the accompanying drawing in which.

Figure 1:
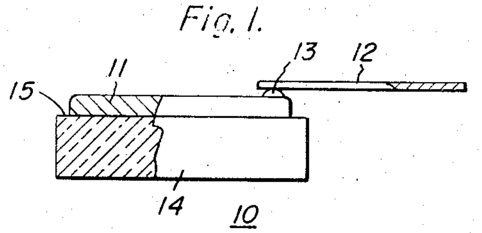
FIGURE 1 is a sectional view of a superconductive connection embodying my invention.

In FIGURE 1 of the drawing, there is shown generally at 10 a superconductive connection which comprises a first superconductive member 11 in the form of a film, a second superconductive member 12 in the form of a strip, and a superconductive alloy solder 13 joining together a portion of the upper surface of film 11 to a portion of the lower surface of member 12. While member 11 is shown in the form of a film, the first superconductive member is also suitable in the form of an unsupported structure, or a layer.

Film 11 is shown supported on the upper surface of a substrate 14 of glass, mica, Vycor, vitreous, ceramic or metallic material. This film is deposited to cover substantially the upper surface of substrate 14, except for a margin 15 around the periphery of the substrate. Film 11 consists of niobium while member 12 consists of another superconductive metal such as lead. If it is desired, both film 11 and member 12 consist of niobium, or member 12 consists of niobium while member 11 consists of another superconductive material such as lead. Alloy solder 13, which provides a superconductive joint between film 11 and member 12, is selected from the group consisting of indium-lead alloys and indium-bismuth alloys.

Figure 2:
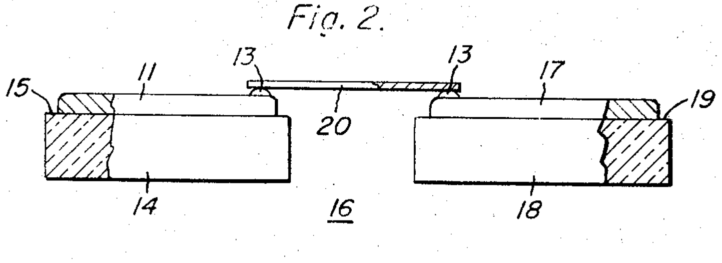
FIGURE 2 is a sectional view of another superconductive connection embodying my invention.

In FIGURE 2 of the drawing, another superconductive connection is shown generally at 16 which comprises a first superconductive member 11 in the form of a film, a second superconductive member 17 in the form of a film, a third superconductive member 20 in the form of a strip adapted to contact a portion of film 11 and film 17, and a superconductive alloy solder 13 joining together a portion of film 11 to member 20 and joining together a portion of film 17 to member 20. Films 11 and 17, which consist of niobium, are supported on substrates 14 and 18, respectively, by being deposited thereon. Each of these films covers substantially the upper surface of its associated substrate except for a margin around the periphery of the respective substrate. Margin 15 is shown surrounding film 11 while margin 19 is shown surrounding film 17. If it is desired, member 20 consists of niobium while films 11 and 17 consist of another superconductive metal such as lead, or film 11, film 17 and member 20 consist of niobium. Superconductive alloy solder 13 is selected from the group consisting of indium-lead alloys and indium-bismuth alloys.

Figure 3:
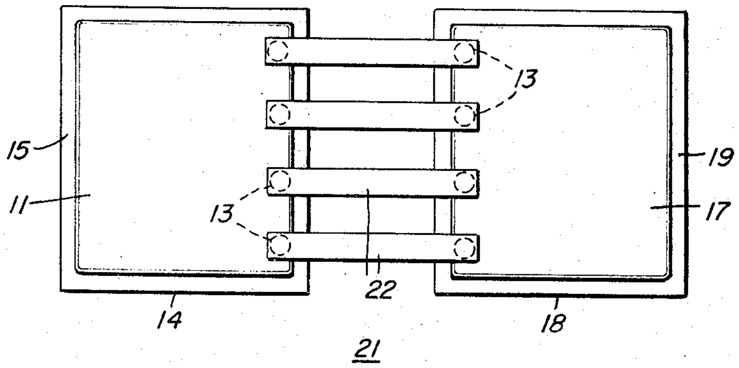
FIGURE 3 is a top plan view of another superconductive connection embodying my invention.

In FIGURE 3 of the drawing, there is shown another superconductive connection at 21. This connection is similar to the connection shown in FIGURE 2 of the drawing wherein the first superconductive member 11 is in the form of a film, and the second superconductive member 17 is in the form of a film. Each of these films is deposited on associated substrates and covers substantially the upper surface of each of these substrates except for a margin around the periphery thereof. A plurality of superconductive members 22, each of which is in the form of a strip are adapted to be connected to the upper surfaces of film 11 and film 17. Superconductive alloy solder 13 joins together each strip 22 and at its opposite ends to film 11 and film 17.

I found unexpectedly that a superconductive connection could be provided which comprised a first superconductive member, a second superconductive member, one or both of the members consisting of niobium, and a superconductive solder joining together a portion of each of the members. The alloy solder is selected from the group consisting of indium-lead alloys and indium-bismuth alloys. I found that it was necessary to employ an alloy solder selected from this group consisting of indium-lead alloys and indium-bismuth alloys to provide a superconductive joint between the members, one of which consists of niobium.

When a niobium member is joined to another niobium member or another superconductive member, the electrical connection therebetween must be a superconductive connection which exhibits good mechanical properties. I found that indium-lead alloys and indium-bismuth alloys provided suitable solders for joining two such members, one or both of which consist of niobium. These solders have the characteristic of being superconductive materials. While ordinary lead-tin alloy solders are employed with superconductive materials such as lead, such solders are not suitable when one of the superconductive members to be joined to another superconductive member consists of niobium. I found further that lead, indium, and bismuth were not suitable solders when one of the superconductive members to be joined to another superconductive member consists of niobium. However, I found unexpectedly that indium-lead alloys and indium-bismuth alloys provided very suitable and satisfactory solders to join two superconductive members, one or both of which consists of niobium.

Further, I found that two niobium members could be joined to a third superconductive member by employing an indium-lead alloy or an indium-bismuth alloy solder. All three members may consist of niobium and be joined with such a solder. One member of niobium may also be joined to two other members of another superconductive material such as lead. The members are in the form of an unsupported structure, a layer, or a film.

The superconductive connection shown in FIGURE 1 of the drawing is produced by depositing a film of niobium on the upper surface of a glass substrate except for a margin area on the upper surface of the substrate. This is accomplished for example in accordance with the method set forth in copending application Ser. No. 311,935, filed Sept. 23, 1963. A member of niobium or other superconductive material is joined to the upper surface of the niobium film by employing an indium-lead or indium-bismuth alloy.

I found that a preferred way to apply the indium-lead alloy solder or indium-bismuth alloy solder was to heat a metal brush, apply the heated brush to a slug of alloy metal thereby melting the alloy onto the metal brush. The solder is then scrubbed onto the niobium film surface. I believe that in this preferred method of applying the solder to the niobium film, a layer of niobium oxide which appears to exist on the niobium layer is decreased in thickness or removed while the solder acts as a shield to prevent further oxidation.

The niobium or other superconductive member is then applied over the molten solder metal and by mechanical pressure held against the niobium film until the solder has hardened providing the superconductive connection. If it is desired, the solder metal may be applied to the niobium film as above described and the other superconductive member applied htereto at a subsequent time by reheating the solder and applying pressure against the member. The superconductive connections shown in FIGURES 2 and 3 are prepared in the same manner as described above for the preparation of the connection shown in FIGURE 1.

An example of a superconductive connection made in accordance with my invention was as follows:

*Example I*

A glass substrate had a film of niobium deposited thereon except for a margin around the periphery around the substrate, in accordance with the above-mentioned copending patent application Ser. No. 311,935. The film was approximately 9300 A. thick. A niobium member in the form of a strip was soldered to the upper surface of this niobium film by employing an indium-lead alloy solder. The indium-lead alloy solder was applied initially to the surface of the niobium film by scrubbing the solder onto the surface of the film with a hot metal brush. While the solder was still molten, the niobium member was pressed against the solder and held under pressure until the solder hradened to make a mechanical joint.

This superconductive connection which comprised the niobium film, the niobium member and the indium-lead alloy solder joining the film and member together was tested subsequently by exposing the connection to a temperature of 4.2° K. at various current densities of 35 to 175 amperes per square centimeter. Electrical contact was made to the connection with a pair of superconductive leads, one of which was affixed to the niobium film while the other lead was affixed to the niobium member. Current flowed from the film through the solder connection and through the niobium member without a drop in potential demonstrating superconductive behavior of the electrical connection.

While other modifications of the invention and variations thereof which may be employed within the scope of the invention have not been described, the invention is intended to include such that may be embraced within the following claims.

What I claim as new and desire to secure by Letters Patent of the United States is:

1. A superconductive connection comprising a first superconductive member, a second superconductive member, one of said members consisting of niobium, and a superconductive alloy solder joining together a portion of each said members, said alloy solder selected from the group consisting of indium-lead alloys and indium-bismuth alloys.

2. A superconductive connection comprising a first niobium member, a second niobium member, and a superconductive alloy solder joining together a portion of each of said members, said alloy solder selected from the group consisting of indium-lead alloys and indium-bismuth alloys.

3. A superconductive connection comprising a niobium member, a lead member, and a superconductive alloy solder joining together a portion of said niobium member to said lead member, said alloy solder selected from the group consisting of indium-lead alloys and indium-bismuth alloys.

4. A superconductive connection comprising a first superconductive member, a second superconductive member, a third superconductive member adapted to contact said first member and said second member, said third member consisting of niobium, and a superconductive alloy solder joining together a portion of said first member and said third member and joining together a portion of said second member and said third member, said alloy solder selected from the group consisting of indium-lead alloys and indium-bismuth alloys.

5. A superconductive connection comprising a first niobium member, a second niobium member, a third superconductive member adapted to contact said first member and said second member, and a superconductive alloy solder joining together a portion of said first member and said third member and joining together a portion of said second member and said third member, said alloy solder selected from the group consisting of indium-lead alloys and indium-bismuth alloys.

6. A superconductive connection comprising a first niobium member, a second niobium member, a third niobium member adapted to contact said first member and said second member, and a superconductive alloy solder joining together a portion of said first member and said third member and joining together a portion of said second member and said third member, said alloy solder selected from the group consisting of indium-lead alloys and indium-bismuth alloys.

7. A superconductive connection comprising a first lead member, a second lead member, at least one niobium member adapted to contact said first lead member and said second lead member, and a superconductive alloy solder joining together a portion of said first lead member and said niobium member and joining together a portion of said second lead member and said niobium member, said alloy solder selected from the group consisting of indium-lead alloys and indium-bismuth alloys.

8. A superconductive connection comprising a first niobium member, a second niobium member, at least one lead member adapted to contact said first and said second member, and a superconductive alloy solder joining together a portion of said first member and each of said lead members and joining together a portion of said second member and said lead member, said alloy selected from the group consisting of indium-lead alloys and indium-bismuth alloys.

9. A superconductive connection comprising a first niobium member, a second niobium member, a plurality of superconductive members adapted to contact said first and said second member, and a superconductive alloy solder joining together a portion of said first member and each of said plurality of members and joining together a portion of said second member and each of said plurality of members, said alloy selected from the group consisting of indium-lead alloys and indium-bismuth alloys.

10. A superconductive connection comprising a niobium member, a superconductive member adapted to contact said niobium member, and a superconductive alloy solder joining together a portion of each of said members, said alloy being an indium-lead alloy.

11. A superconductive connection comprising a first niobium member, a second niobium member, a plurality of superconductive members adapted to contact said first and said second niobium members, and a superconductive alloy solder joining together a portion of said first member and each of said plurality of members and joining together a portion of said second member and each of said plurality of members, said alloy being an indium-lead alloy.

References Cited

UNITED STATES PATENTS

| | | | |
|---|---|---|---|
| 3,181,936 | 5/1965 | Denny | 29—191 |
| 3,184,303 | 5/1965 | Grobin | 29—194 |

OTHER REFERENCES

"Superconductors," published AIME, February 1962, pp. 27–31.

HYLAND BIZOT, *Primary Examiner.*